(12) United States Patent
Hsueh-Ming

(10) Patent No.: US 7,145,252 B2
(45) Date of Patent: Dec. 5, 2006

(54) CONFIGURATION FOR TESTING THE BONDING POSITIONS OF CONDUCTIVE DROPS AND TEST METHOD FOR USING THE SAME

(75) Inventor: Tasi Hsueh-Ming, Tainan (TW)

(73) Assignee: Chi Mei Optoelectronics Corp., Tainan (TW)

( * ) Notice: Subject to any disclaimer, the term of this patent is extended or adjusted under 35 U.S.C. 154(b) by 0 days.

(21) Appl. No.: 10/996,652

(22) Filed: Nov. 23, 2004

(65) Prior Publication Data

US 2005/0121797 A1    Jun. 9, 2005

(30) Foreign Application Priority Data

Dec. 2, 2003    (TW)    ............................... 92133937 A

(51) Int. Cl.
*H01L 23/48* (2006.01)
(52) U.S. Cl. .................. 257/786; 257/734; 257/735; 257/773; 257/776; 257/E23.02
(58) Field of Classification Search .................... None
See application file for complete search history.

(56) References Cited

U.S. PATENT DOCUMENTS

| | | | | | |
|---|---|---|---|---|---|
| 5,894,170 | A | * | 4/1999 | Ishikawa ...................... 257/775 |
| 6,476,506 | B1 | * | 11/2002 | O'Connor et al. .......... 257/786 |
| 6,650,021 | B1 | * | 11/2003 | Stamper et al. ............. 257/786 |
| 2004/0135250 | A1 | * | 7/2004 | Hung .......................... 257/738 |

* cited by examiner

*Primary Examiner*—Jasmine Clark
(74) *Attorney, Agent, or Firm*—Thomas, Kayden, Horstemeyer&Risley

(57) ABSTRACT

Configuration for testing the bonding positions of conductive drops and test method by using the same is disclosed. In the invention, a special configured contact pad for setting a conductive drop and an associated wire pattern are useful for knowing the drop condition of single or several displaying panels. The contact pad comprises at least two conductive members respectively coupled to two wires; and an isolating portion between conductive members for separation. The normal dropping position of a conductive drop on the contact pad includes at least a portion of the conductive members. Accordingly, the contact pad is originally an open-circuit without conductive drop thereon, but the contact pad is conductive when the contact drop sets on its normal dropping position. Whether the conductive drop forms on the normal dropping position of the contact pad is determined by measuring the electrical properties of the contact pad.

25 Claims, 4 Drawing Sheets

CONFIGURATION FOR TESTING THE BONDING POSITIONS OF CONDUCTIVE DROPS AND TEST METHOD FOR USING THE SAME

CROSS-REFERENCE TO RELATED APPLICATION

This application claims the benefit of Taiwan application Serial No. 092133937, filed Dec. 2, 2003.

TECHNICAL FIELD

The invention relates in general to a configuration for testing the bonding positions of conductive drops and test methods for using the same, and more particularly to a configuration applied in a flat panel display for testing the bonding positions of conductive drops and test methods for using the same.

BACKGROUND

A flat panel display, such as liquid crystal display (LCD), organic electro-luminescent display (OELD) or liquid crystal on silicon (LCOS), plays an important role as a communication interface between people and the information in the modern living. The flat panel display is assembled using a first and a second substrate. Before assembling, one or several contact pads for positioning conductive drops (for example, Au drop or Ag drop) are formed at one of the substrates (for example, substrate having thin film transistors (TFT) or organic electro-luminescent diodes, or silicon substrate). After completing the assembly of the second substrate and the first substrate, the substrates are electrically connected through the contact pads and the conductive drops.

In general, the flat panel display comprises two substrates. One substrate comprises several electronic components (i.e. switches, transistors, diodes, capacitors, etc.), electrodes and conductive lines, and the other substrate comprises electrodes, conductive lines or a color filter (CF). An example of a flat panel display is a Thin Film Transistor-Liquid Crystal Display (TFT-LCD), which comprises a first substrate, a second substrate and a Liquid Crystal (LC) medium (i.e. numerous LC molecules) therebetween. The first substrate (such as a transparent glass) comprises thin film transistors (TFTs) arranged in an array, pixel electrodes, orthogonal scan (gate) lines and data (signal) lines. The second substrate (such as a transparent glass) comprises the CFs. In the traditional method of fabricating the Liquid Crystal Display (LCD), the second substrate having CFs and sealant is aligned and pressed with the first substrate having TFTs. The sealant is then cured for assembling the second substrate and the first substrate. For small size display, the cell (i.e. space between the substrates) is a vacuum, which is created by capillary attraction after two substrates are assembled. But for large size display, the newly developed method, call "one drop fill" (ODF), is to drop the LC directly on the substrate before the two substrates are aligned and assembled.

Whether a large size display or a small-sized-display is manufactured, one or several contact pads are formed at one (for example, the lower substrate having TFT) of the substrates for positioning conductive drops (i.e. Au drops or Ag drops) before the substrates are assembled. Referring to FIG. 1, a conventional panel having the contact pads is illustrated. Also, FIG. 1 illustrates a small size (ex: 1.79") panel. Two contact pads 102, 104, which are made from a conductive material, are positioned at the corners of a panel 100. The two contact pads 102 and 104 are coincident with the bonding positions of conductive drops.

However, the conductive drops could miss the positions of the contact pads, due to the misdrop by a machine or other factors. Applying the conductive drops to a position other than the contact pads 102 and 104 results in an electrical-connection flaw on the display, which is typically noticed after assembly of the substrates. The conventional design of the contact pad cannot prevent or test whether the conductive drops miss the positions of the contact pads.

SUMMARY

It is therefore desired to provide a configuration for testing the bonding positions of conductive drops and test methods by using the same. By providing a contact pad with special design and the related testing configuration, it can be quickly observed whether the conductive drops are formed at the dropping positions of a single panel or a plurality of panels.

One embodiment can be implemented by providing a contact pad. The contact pad, applied to a substrate, and the contact pad is positioned on the substrate relative to a dropping position of a conductor. The contact pad includes a first conductive member, and a second conductive member. The dropping position of the conductor involves at least a portion of the first conductive member and at least a portion of the second conductive portion.

Embodiments of the present invention can also be viewed as providing methods for testing bonding position of conductor. The method includes the steps of providing a contact pad on the substrate and applying the conductive material to the substrate. The substrate defines a dropping position for a conductive material, and the contact pad is positioned on the substrate relative to the dropping position. The contact pad includes a first conductive member and a second conductive member. The dropping position of the conductor involves at least a portion of the first conductive member and at least a portion of the second conductive portion.

Other objects, features, and advantages will become apparent from the following detailed description of the preferred but non-limiting embodiments. The following description is made with reference to the accompanying drawings.

DETAILED DESCRIPTION

Figure 1:
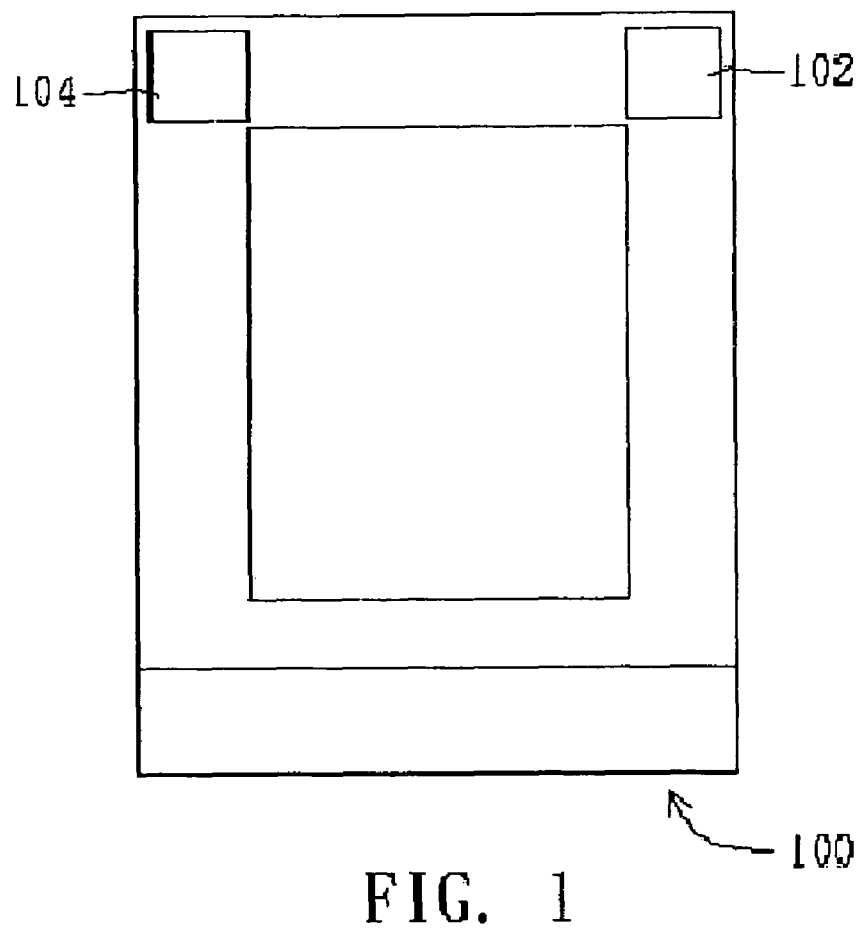
FIG. 1 (prior art) illustrates a conventional panel having two contact pads.
Figure 2:
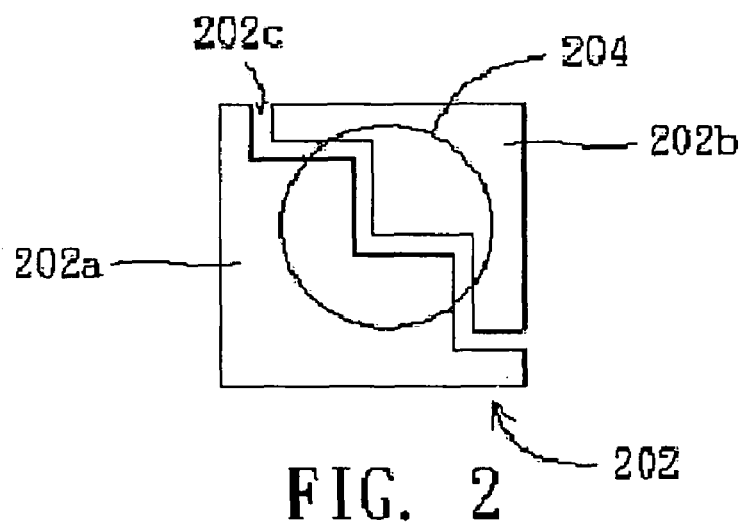
FIG. 2 illustrates a new exemplary contact pad.

In one embodiment, a new contact pad with a special figure and a related test configuration is utilized for testing whether a conductive drop is applied at the contact pad. FIG. 2 illustrates a non-limiting example of one type of a new contact pad 202. The contact pad 202 includes two conductive members 202a and 202b, and an insulating portion 202c between the conductive members 202a, 202b. The insulating portion 202c interposes the conductive members 202a and 202b such that the conductive members 202a and 202b are not directly electrically connected. Therefore the insulating portion 202c is a gap or an insulator. The dashed circle 204 represents the "dropping position" for a conductive drop. The dropping position 204 includes at least a portion of the conductive member 202a, at least a portion of the conductive member 202b, and at least a portion of the insulating portion 202c. When a conductive drop is applied to the contact pad 202 at the dropping position of a conductive drop, the conductive drop forms an electrical bridge between the conductive members 202a and 202b such that there is electrical continuity between the conductive members 202a and 202b.

Accordingly, the contact pad 202 of the invention possesses the function of "the switch". If the conductive drop is positioned at the dropping position 204 on the contact pad 202, "the switch" is on; if not, "the switch" is off. The contact pad 202 could be made of any conductive material, such as indium tin oxide (ITO), aluminum (Al), molybdenum (Mo), chromium (Cr), copper (Cu), alloy (such as aluminum alloy, copper alloy, molybdenum alloy), or combination of metal layers (such as ITO layer and Al layer, ITO layer and Al alloy layer, ITO layer and Mo layer, ITO layer and Al layer and Mo layer, ITO layer and Al alloy layer and Mo alloy layer, Al layer and Mo layer, Al alloy layer and Mo alloy layer). A conductive drop could be a gold (Au) drop or a drop of another electrical conductor.

It is noted that the contact pad 202 shown in FIG. 2 is non-limiting. The numbers and shapes of the conductive members and the insulating portions of the contact pad can be optionally varied if the contact pad similarly functions as a switch, which means that the conductive members are electrically connected after applying a conductive drop.

A contact pad can be applied to a single panel or a plurality of panels. The configurations for testing the bonding positions of conductive drops can be optionally developed, depending on the application. A first embodiment and a second embodiment are provided for illustrating test configurations and methods of single panel and several panels, respectively. Also, the embodiments disclosed herein are for illustrating the invention, but not for limiting the scope of the invention. Additionally, for the sake of clarity, the drawings show the major characteristic parts. Accordingly, the specification and the drawings are to be regard as illustrative and non-limiting.

First Embodiment

Configuration for Testing a Single Panel and Test Method Using the Same

In the first embodiment, a single panel having two contact pads (as shown in FIG. 2) and two dropping positions for conductive drops is discussed. The two contact pads are formed on the panel and wires are formed to connect the contact pads. Among other things, the wires are used for testing whether conductive drops are set on the dropping positions of the panel. The wiring pattern of the wires could be modified according to the practical application. For example, the wiring pattern of a panel in which all the contact pads receive conductive drops can be different from the wiring pattern of a panel in which only some contact pads receive conductive drops. The details are described below.

EXAMPLE 1

Figure 3A:
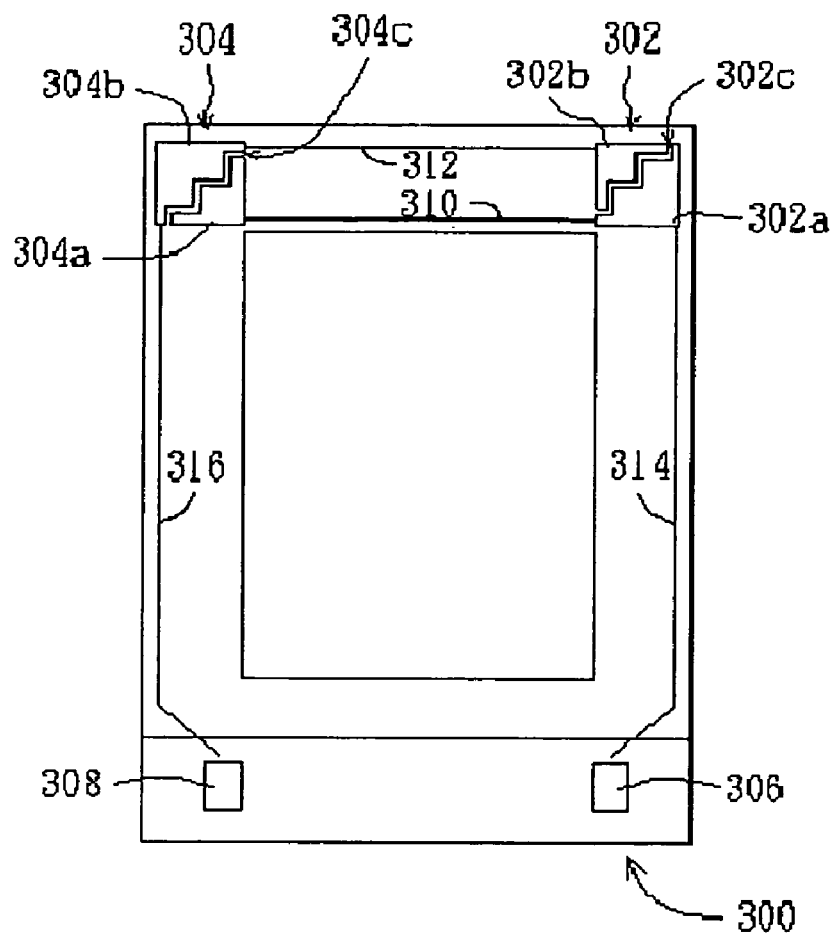
FIG. 3A illustrates a panel having the two exemplary new contact pads and a test configuration.

FIG. 3A illustrates a panel 300 having contact pads and a test configuration according to the first embodiment. In FIG. 3A, contact pads 302 and 304 are formed at the corners of the panel 300 for the positioning of conductive drops. The contact pads 302, 304 could be made of any conductive material, such as ITO, Al, Mo, Cr, Cu, alloy (such as Al alloy, Cu alloy, Mo alloy), or combination of metal layers (such as ITO layer and Al layer, ITO layer and Al alloy layer, ITO layer and Mo layer, ITO layer and Al layer and Mo layer, ITO layer and Al alloy layer and Mo alloy layer, Al layer and Mo layer, Al alloy layer and Mo alloy layer). Each contact pad comprises two conductive members and an insulating portion. As shown in FIG. 3, the contact pad 302 (at the right corner of the panel 300) comprises the conductive members 302a and 302b, and an insulating portion 302c between the conductive members 302a and 302b. The insulating portion 302c prevents direct electrical connection between the conductive members 302a and 302b. The contact pad 304 (at the left corner of the panel 300) comprises conductive members 304a and 304b, and an insulating portion 304c between the conductive members 304a and 304b. The insulating portion 304c prevents direct electrical connection between the conductive members 304a and 304b. Also, a first wire 310 connects the conductive members 302a and 304a; a second wire 312 connects the conductive members 302b and 304b. The conductive members 302a and 304b are connected to test pads 306 and 308 through a wire 314 and a wire 316, respectively. The test pads 306 and 308 could be made of any conductive material, such as ITO, Al, Mo, Cr, Cu, alloy (such as Al alloy, Cu alloy, Mo alloy), or combination of metal layers (such as ITO layer and Al layer, ITO layer and Al alloy layer, ITO layer and Mo layer, ITO layer and Al layer and Mo layer, ITO layer and Al alloy layer and Mo alloy layer, Al layer and Mo layer, Al alloy layer and Mo alloy layer).

Figure 3B:
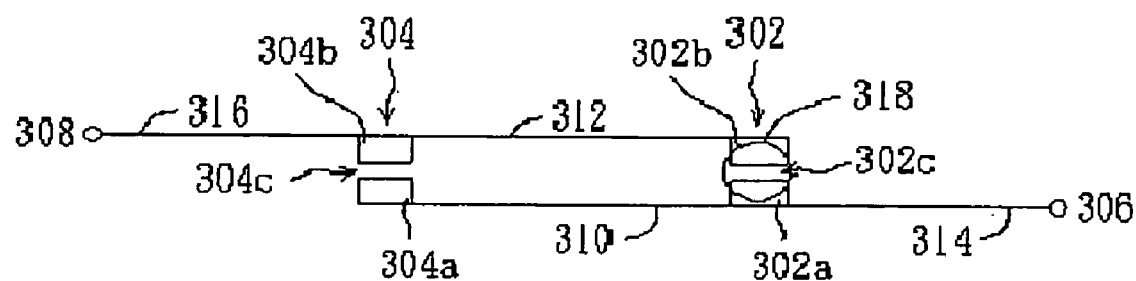
FIG. 3B is a circuit drawing of FIG. 3A.

FIG. 3B is a circuit drawing of FIG. 3A with a conductive drop 318 applied to the contact pad 302. When a conductive drop is correctly applied to one of the contact pads, the conductive drop electrically bridges the insulating portion of that conductive pad so that the conductive members of that contact pad are electrically connected. For example, the conductive drop 318, which can be an Au drop, has been correctly applied to the contact pad 302 such that the conductive members 302a and 302b are electrically connected. Consequently, the circuit (illustrated in FIG. 3B) comprising, the wire 314, the contact pad 302, the wire 312, the conductive member 304b, and the wire 308 has electrical continuity and is conductive. The electrical properties including, but not limited to, resistance, conductance, inductance, and capacitance of the circuit illustrated in FIG. 3B are function of the materials that make up the circuit and the elements of the circuit. One or more of these electrical properties can be measured to determine whether or not the circuit is completed, i.e., there is electrical continuity between the test pads 306 and 308. For example, if the resistance between the test pads 306 and 308 were finite, then there is electrical connectivity, i.e., the contact pad 302 having the conductive drop 318 correctly applied is a "closed switch". Similarly, if a conductive drop is correctly applied on the contact pad 304, then there is also electrical continuity between the test pads 306 and 308.

Therefore, the wire pattern as shown in FIG. 3A and FIG. 3B is applicable for testing whether at least one contact pad of the panel is correctly bonded with a conductive drop.

EXAMPLE 2

Figure 4A:
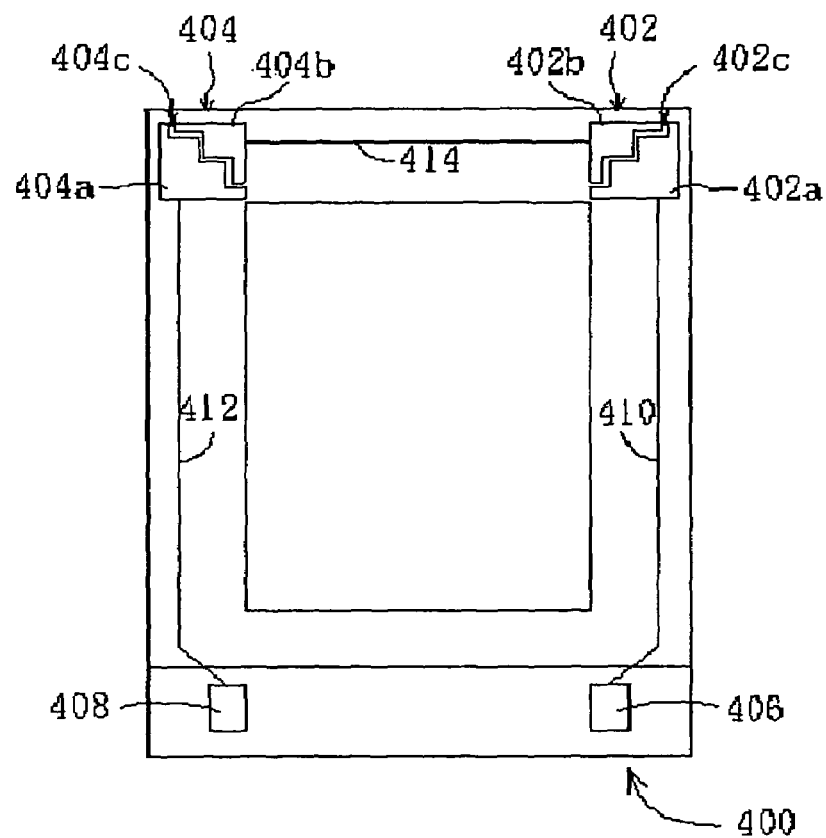
FIG. 4A illustrates another panel having two exemplary new contact pads and a second test configuration.

FIG. 4A illustrates another panel 400 having a pair of contact pads 402 and 404, and FIG. 4A also illustrates another test configuration according to the first embodiment. In FIG. 4A, the contact pads 402 and 404 are formed at the corners of the panel 400 for the positioning of conductive drops. The contact pad 402 (at the right corner of the panel 400) comprises conductive members 402a and 402b, and an insulating portion 402c between the conductive members 402a and 402b. The insulating portion 404c prevents direct electrical connection between the conductive members 404a and 404b. The contact pad 404 (at the left corner of the panel 400) comprises the conductive members 404a and 404b, and an insulating portion 404c between the conductive members 404a and 404b. The insulating portion 404c prevents direct electrical connection between the conductive members 404a and 404b. The conductive members 402a and 404b are connected to test pads 406 and 408 through a wire 410 and a wire 412, respectively. The contact pads 402, 404 and the test pads 406, 408 could be made of any conductive material, such as ITO, Al, Mo, Cr, Cu, alloy (such as Al alloy, Cu alloy, Mo alloy), or combination of metal layers (such as ITO layer and Al layer, ITO layer and Al alloy layer, ITO layer and Mo layer, ITO layer and Al layer and Mo layer, ITO layer and Al alloy layer and Mo alloy layer, Al layer and Mo layer, Al alloy layer and Mo alloy layer).

In this embodiment, only one wire, wire 414, connects the contact pads 402 and 404. As shown in FIG. 4A, the conductive member 404b is connected to the conductive member 402b through the wire 414.

Figure 4B:
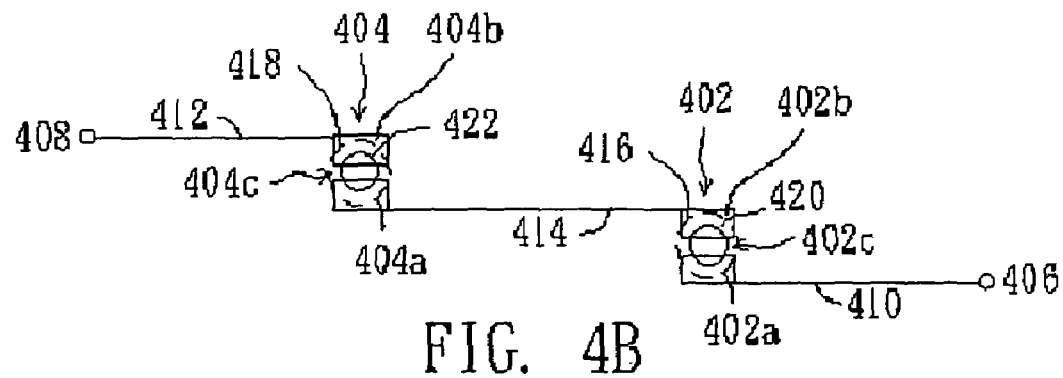
FIG. 4B is a circuit drawing of FIG. 4A.

Referring to FIG. 4B, FIG. 4B is a circuit drawing of FIG. 4A with conductive drops 420 and 422 applied to contact pads 402 and 404, respectively. In FIG. 4B, the dashed circles illustrate the dropping positions 416 and 418, which are coincident with the contact pads 402 and 404, respectively. In FIG. 4A, both contact pads 402 and 404 are "open switches" because their respective conductive members are not electrically connected. Consequently, the test pads 406 and 408, as shown in FIG. 4A, are not electrically connected through the circuit comprising wiring 410, 412, and 414, and the contact pads 402 and 404.

FIG. 4B illustrates the circuit of panel 400 after the conductive drops 420 and 422 have been applied to the contact pads 402 and 404, respectively. The conductive drop 420, which was applied at the dropping position 416, is disposed over portions of the conductive members 402a and 402b and a portion of the insulation portion 402c. The conductive drop 422, which was applied at the dropping position 418, is disposed over portions of the conductive members 404a and 404b and a portion of the insulation portion 404c. Consequently, contact pads 402 and 404 are functionally "closed switches", and the test pads 406 and 408 are electrically connected through the wiring 410, 412, and 414 and through the contact pads 402 and 404.

After finishing the dropping of the conductive drops, the resistance between the test pads 406 and 408 is measured. If a finite resistance between the test pads 406 and 408 is obtained, that means all of the contact pads are correctly bonded with the conductive drops; if not, that means at least one contact pad failed to bond with the conductive drop (i.e. the conductive drop fell outside of the bonding position, or the dropping position of the conductive drop didn't connect the conductive members).

Therefore, the wire pattern as shown in FIG. 4A, 4B is applicable for testing whether all of the contact pads of the panel are correctly bonded with the conductive drops.

Second Embodiment

Figure 5:
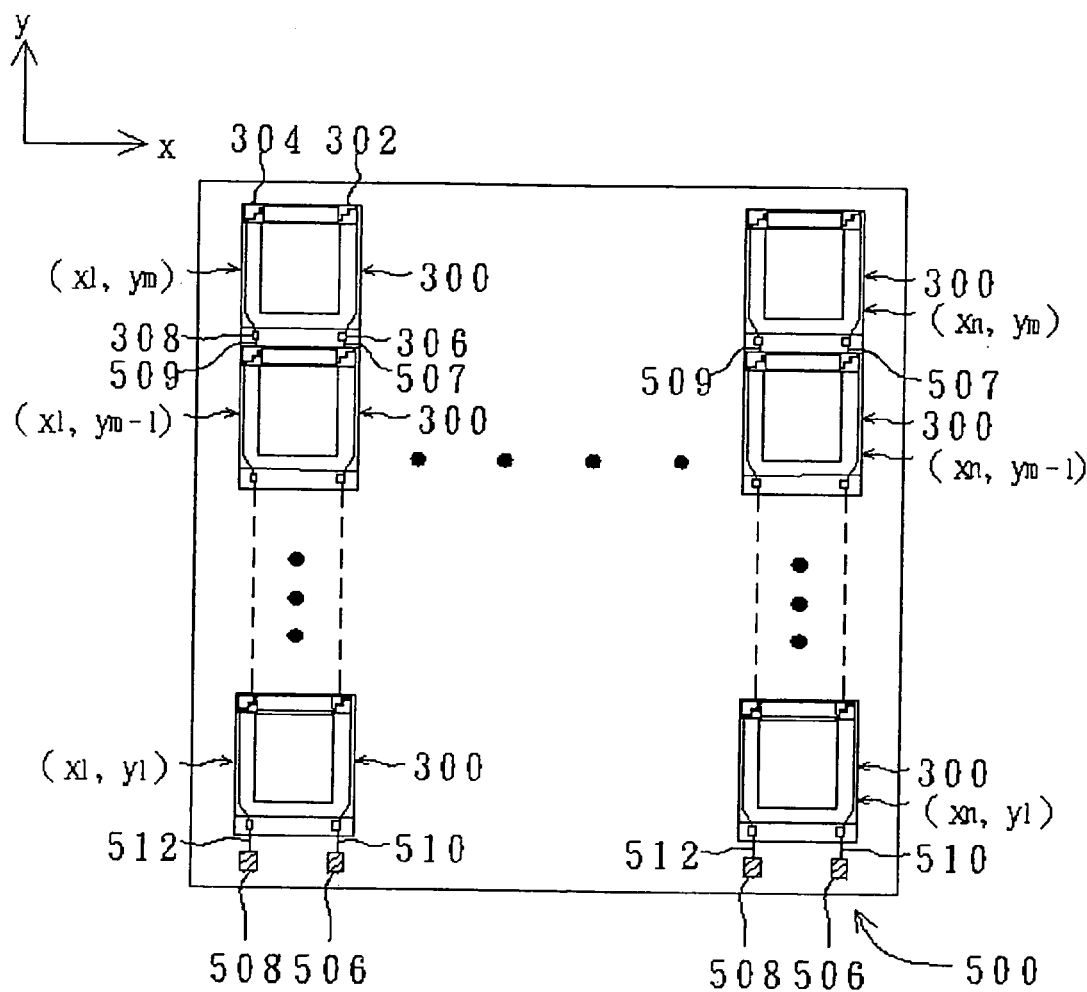
FIG. 5 illustrates a test configuration for a plurality of panels.

Configuration for Testing a Mother Substrate with Several Panels and Test Method Using the Same FIG. 5 illustrates a test configuration for a plurality of panels according to the second embodiment of the invention. In FIG. 5, an assembly element 500 includes a plurality of the panels 300 are formed, and each panel 300 included in FIG. 5 has a test configuration corresponding to the panel 300 of FIG. 3A. It is, of course, understood that the test configuration on the panel 400 (FIG. 4A) or other test configuration comprising more than two contact pads on the panel could be used in the practical application. The contact pad 300 (an insulating means between conductive members) and the wire pattern on a single panel have been described in the description of FIG. 3 and is not repeated.

As shown in FIG. 5, the panels 300 are arranged as an array which has X direction and Y direction on an assembly element 500. So the panels 300 are arranged from X1 column (X1,Y1)~(X1,Ym) to Xn column (Xn,Ym) or from Y1 row (X1,Y1)~(Xn,Y1) to Ym row(X1,Ym)~(Xn,Ym). An array is comprised of the n columns X1–Xn of panels 300, and m rows Y1–Ym of panels 300. Each panel 300 in the Y direction of panels is connected to its adjacent panels by a pair of coupling wires 507 and 509. Wire 507 extends from one of the conductive members of the contact pad 302 in a first panel 300 to the test pad 306 of a second panel 300, where the second panel is above and adjacent to the first test panel. Similarly, wire 509 extends from one of the conductive members of the contact pad 304 in the first panel 300 to the test pad 308 of the second panel 300. A pair of test wires 510 and 512 extend from the panel that is at the edge of the Y direction to chief test pads 506 and 508. Wire 510 extend from the test pad 306 of the edge of the Y direction panel to the chief test pad 506, and wire 512 extends from the test pad 308 to the chief test pad 508.

After finishing the dropping of the conductive drops, if the resistance between the chief test pads 506 and 508 is finite, then there is electrical connectivity between the chief test pads 506 and 508. The resistance between the chief test pads 506 and 508 is measured for checking the bonding condition for each column of panels. Since each column of panels are wired in series, every panel required the conductive drop(s) dropping at the appropriate position(s) (i.e. dropping at one or all contact pads, depending on the wire patterns as described in the first embodiment). The columns of panels in the array are tested one by one. For a column, the resistance between the chief test pads 506 and 508 is measured, and if the measured resistance equals (within a margin of error) a predetermined value, then the conductive drops have been correctly applied to the contact pads within that column. In which case, each panel in the column has been tested and each contact pad is determined to be a closed circuit. On the other hand, if the measured resistance is not equal to (within a margin of error) the predetermined value, then at least one contact pad is an open circuit. In that case, the panels within that column are electrically separated and tested one by one to find the contact pads or contact pads that are open circuits.

In the practical fabrication, an assembly element 500 could be a first substrate having several TFT panels, and assembled with the other second substrate having several CF panels. After cutting the assembled substrates according to the standard method, several displays are produced.

Accordingly, the large-sized substrate having several panels and the test configuration of the invention has the advantage of testing the bonding positions of conductive drops so as to increase the yield of the production. It reduces the amount of time testing by testing groups of panels together, and if a problem is detected with a group of panels, then the panels within the group can be individually tested or a sub-group of the group can be tested, individually or together. For a massive production, the configuration and the test method according to the invention do improve the yield and save the production time.

Although the panels 300 on the substrate are illustrated as grouped into several columns that was done only as an illustration of one embodiment. In another embodiment, the panels on a substrate could be divided into several rows, and the panels of each row are serially wired for quick check. Also, the panels on the substrate could be regularly wire-connected in a slanted direction or in a Z-shaped direction, or could be irregularly wire-connected for quick check.

Also, FIG. 5 shows the test pads (306, 308) of a panel are wired connected to the contact pads of adjacent panel, however, the invention is not limited in this configuration. The test pads of each panel could directly touch the contact pads of adjoining panel.

Moreover, it is not necessary to form the chief test pads 506, 508 for each group of the panels at the outside of the panels. The test pads on the last panel could be used as the chief test pads. Accordingly, the positions of the chief test pads depend on the situation of applications (i.e. facilitation of testing steps).

Fabrication of the Test Configuration

The test configuration (comprises the contact pads and the wire pattern) as described as previously described in conjunction with FIGS. 3A and 4A could be formed using one step after the manufacture of the electronic components and devices of the panel are completed, or could be formed between the manufacturing steps of the electronic components and devices of the panel.

In one embodiment, a panel having TFTs is produced in five processes. The first, the third and the fifth processes are related to the formation of conductive components. The second and the fourth processes are related to the formation of nonconductive components. The test configuration could be formed by an additional process (i.e. the sixth process) after the five processes are completed. Also, the conductive parts (i.e. the conductive members of contact pads, the connecting wires, the test wires, the test pads and the chief test pads) of the test configuration could be formed in the first, the third and the fifth processes. Similarly, the non-conductive parts (i.e. the insulating portions of contact pads) of the test configuration could be formed in the second and the fourth processes.

Figure 6:
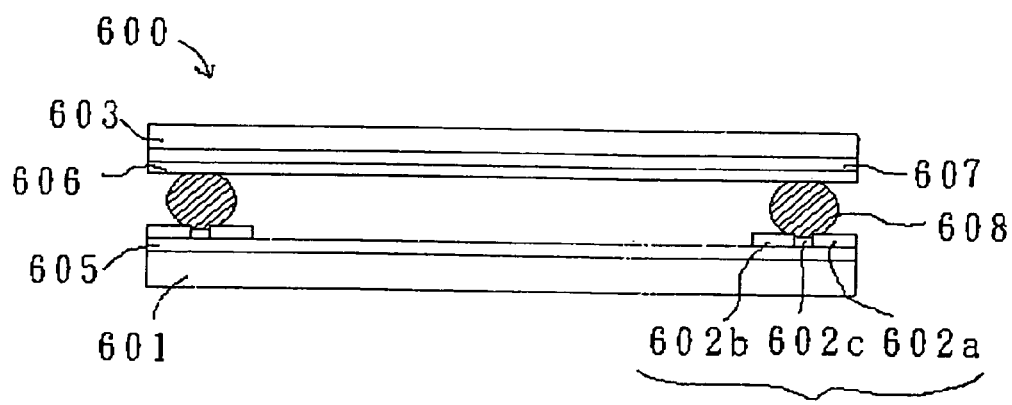
FIG. 6 illustrates a side view of a flat panel display.

FIG. 6 illustrates a side view of a flat panel display 600. The flat panel display 600 includes a contact pad 602, a first substrate 601, a second substrate 603, and a conductive drop 608. The contact pad 602 is disposed on the substrate 601. Typically, the contact pad 602 is formed on the first substrate, but in some embodiments, the contact pad 602 is applied to the substrate 603. The contact pad 602 is configured to have a first conductive member 602a, a second conductive member 602b, and an insulating portion 602c interposing the conductive members. The contact pad is approximately coincident with a dropping position for a conductor for the first substrate 601. The conductive drop 608 has been provided to the contact pad 602. A conductive layer 606 and a functional layer 607 are formed on the second substrate 603. The functional layer 607 includes CF layers or Black Matrix layers or insulating layer. Another functional layer 605 includes TFT layers or EL layers or conductive layer on the first substrate. The first and second substrates are in electrical continuity through the conductive drop 608.

While the invention has been described by way of examples and in terms of the preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A contact pad, applied to a substrate, and the contact pad is positioned on the substrate relative to a dropping position of a conductor, the contact pad comprising:
   a first conductive member;
   a second conductive member;
   an insulating means interposing the first conductive member and the second conductive member; and
   wherein the dropping position of the conductor involves at least a portion of the first conductive member and at least a portion of the second conductive member.

2. The contact pad according to claim 1, wherein the insulating means is a gap.

3. The contact pad according to claim 1, wherein the insulating means is an insulating material.

4. The contact pad according to claim 1, wherein the first conductive member and the second conductive member are electrically connected when the conductor is disposed at the dropping position.

5. The contact pad according to claim 1, wherein the contact pad is an open circuit if the conductor is not disposed on the dropping position.

6. A configuration for testing bonding position of conductor, applied to a substrate having a dropping position for a conductor, the configuration comprising:
   at least two contact pads disposed on the substrate, and each contact pad at least comprising:
   two conductive members; and
   an insulating means positioned between the two conductive members; wherein each of the two contact pads have at least two wires extending therefrom, and wherein one of the at least two wires connects one contact pad to the other contact pad,
   wherein the dropping position involves at least a portion of the conductive members of one of the contact pads; and
   wherein at least one of the contact pads is disposed on the substrate approximately coincident to the dropping position.

7. The configuration according to claim 6, wherein the conductive members of the contact pads are electrically connected if the conductor is provided at the dropping position.

8. The configuration according to claim 6, wherein the conductor is a conductive glue, the conductive member is made of a conductive material and the insulating means is a gap.

9. The configuration according to claim 6, wherein the conductor is a conductive glue, the conductive member is made of a conductive material and the insulating means is an insulating material.

10. The configuration according to claim 6 wherein for each contact pad one of the at least two wires extending therefrom extends to a test pad, and the test pad is used for testing whether the configuration is conductive.

11. The configuration according to claim 10, wherein the test pad is made of a conductive material.

12. The configuration according to claim 6, wherein the substrate is adapted to be electrically connected to another substrate by disposing the conductor on the dropping position.

13. The contact pad according to claim 1, wherein the first conductive member is connected to one end of a first wire and the second conductive member is connected to one end of a second wire.

14. The contact pad according to claim 13, wherein the conductor is a conductive glue; the first and second conductive members of the contact pad are made of a conductive material.

15. The contact pad according to claim 13, wherein the substrate is electrically connected to another substrate by disposing the conductor on the contact pad.

16. A flat panel display comprising:
a first substrate;
a second substrate; and
a contact pad disposed on one of the substrates, the contact pad is positioned relative to a dropping position of a conductor, the contact pad including:
a first conductive member;
a second conductive member; and
an insulating means interposing the first conductive member and the second conductive member;
wherein the dropping position of the conductor involves at least a portion of the first conductive member and at least a portion of the second conductive member.

17. The flat panel display according to claim 16, wherein the insulating means is a gap.

18. The flat panel display according to claim 16, wherein the insulating means is an insulating material.

19. The flat panel display according to claim 16, wherein the first conductive member connected to one end of a first wire; the second conductive member connected to one end of a second wire.

20. The flat panel display according to claim 16, wherein the first conductive member and the second conductive member are electrically connected when the conductor is disposed at the dropping position.

21. The flat panel display according to claim 16, wherein the contact pad is an open circuit if the conductor is not disposed on the dropping position.

22. The flat panel display according to claim 16, wherein the conductor is a conductive glue; the first and second conductive members of the contact pad are made of a conductive material.

23. The flat panel display according to claim 16, wherein the contact pad electrically connecting the first and second substrate through a conductor disposed on the contact pad.

24. The flat panel display according to claim 16 is a liquid crystal display (LCD), and the first substrate comprises thin film transistors (TFTs) and the second substrate comprises color filters (CFs), and a LC medium is filled between the first substrate and the second substrate.

25. The flat panel display according to claim 24, wherein the contact pad is provided at the first substrate having TFTs.

* * * * *